(12) United States Patent
Yoshioka (10) Patent No.: US 8,503,247 B2
(45) Date of Patent: Aug. 6, 2013

(54) SEMICONDUCTOR STORAGE APPARATUS, AND METHOD AND SYSTEM FOR BOOSTING WORD LINES

(75) Inventor: Hiroshi Yoshioka, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 382 days.

(21) Appl. No.: 12/826,054

(22) Filed: Jun. 29, 2010

(65) Prior Publication Data

US 2011/0032783 A1     Feb. 10, 2011

(30) Foreign Application Priority Data

Aug. 6, 2009 (JP) ................................. 2009-183251

(51) Int. Cl.
*G11C 11/34* (2006.01)
(52) U.S. Cl.
USPC ................................................. 365/185.23
(58) Field of Classification Search
USPC ................................................. 365/185.23
See application file for complete search history.

(56) References Cited

U.S. PATENT DOCUMENTS

| | | | |
|---|---|---|---|
| 5,184,035 A | | 2/1993 | Sugibayashi |
| 5,631,867 A | * | 5/1997 | Akamatsu et al. ....... 365/189.09 |
| 5,709,387 A | * | 1/1998 | Matczak ................... 277/562 |
| 6,044,035 A | * | 3/2000 | Kohno ................... 365/230.06 |
| 6,268,761 B1 | | 7/2001 | Naganawa |
| 7,571,413 B1 | * | 8/2009 | Ghosh Dastidar et al. ... 716/136 |
| 2001/0019286 A1 | | 9/2001 | Naganawa |
| 2002/0031032 A1 | | 3/2002 | Ooishi |
| 2007/0103406 A1 | * | 5/2007 | Kim ................................. 345/76 |
| 2008/0238536 A1 | * | 10/2008 | Hayashi et al. ............... 327/537 |

FOREIGN PATENT DOCUMENTS

| | | |
|---|---|---|
| JP | 04-19897 | 1/1992 |
| JP | 08-190437 | 7/1996 |
| JP | 11-308855 A | 11/1999 |
| JP | 11-353879 A | 12/1999 |
| JP | 2004-280805 | 10/2004 |

OTHER PUBLICATIONS

Kiyoo Ito, "Advanced Electronics Series I-9; VLSI Memory", Nov. 1994, pp. 310-315.
Office Action issued in Japanese Patent Application No. JP-2009-183251, mailed Apr. 16, 2013.

* cited by examiner

*Primary Examiner* — Hoai V Ho
*Assistant Examiner* — Min Huang
(74) *Attorney, Agent, or Firm* — Arent Fox LLP (57) ABSTRACT

A semiconductor storage apparatus includes: a word line coupled to a cell transistor; a first capacitor having a first end coupled to the word line; a boost driver coupled to a second end of the first capacitor; a voltage-drop circuit configured to generate a given voltage drop between a first voltage and a second voltage; and a boost-drive circuit configured to boost a voltage at the second end from the second voltage to the first voltage.

10 Claims, 14 Drawing Sheets

SEMICONDUCTOR STORAGE APPARATUS, AND METHOD AND SYSTEM FOR BOOSTING WORD LINES

CROSS-REFERENCE TO RELATED APPLICATIONS

This application claims the benefit of priority from Japanese Patent Application No. 2009-183251 filed on Aug. 6, 2009, the entire contents of which are incorporated herein by reference.

BACKGROUND

1. Field

The embodiments discussed herein relate to a storage apparatus.

2. Description of Related Art

Data may be written in a memory cell in a semiconductor storage apparatus, such as a ferroelectric random access memory (FeRAM) or dynamic random access memory (DRAM) by an activating word line in accordance with a row address. In a DRAM, a word line is activated and a voltage is applied to one end of a memory capacitor via a cell transistor. When writing data in an FeRAM, a word line is activated, data of a bit line is written in a memory cell via a cell transistor and the word line is deactivated after writing the data. In a FeRAM, both a word line and a plate line are activated to write data in a ferroelectric cell.

Related technologies are disclosed in Japanese Laid-open Patent Publication No. H11-353879, Japanese Laid-open Patent Publication No. H11-308855, and non-patent Japanese-language document, Kiyoo Ito, "Advanced Electronics Series I-9: VLSI Memory" pp. 310-315, 1994 November, Bifukan.

SUMMARY

According to one aspect of the embodiments, a semiconductor storage apparatus is provided which includes: a word line coupled to a cell transistor; a first capacitor having a first end coupled to the word line; a boost driver coupled to a second end of the first capacitor; a voltage-drop circuit configured to generate a given voltage drop between a first voltage and a second voltage; and a boost-drive circuit configured to boost a voltage at the second end from the second voltage to the first voltage.

Additional advantages and novel features of the invention will be set forth in part in the description that follows, and in part will become more apparent to those skilled in the art upon examination of the following or upon learning by practice of the invention.

DESCRIPTION OF EMBODIMENTS

In an FRAM or DRAM, a word line may receive a boost voltage higher than the voltage applied to a memory cell. For example, when a word line is activated with a supply voltage VDD, a voltage VDD-Vth is applied to a storage node of the memory cell. The threshold voltage Vth may cause a decrease in a data writing level or a data writing speed.

The boost voltage may be generated internally by a boost-voltage generating circuit. The word line may be boosted to a high voltage through capacitive coupling by a capacitor. With capacitive coupling by a capacitor, a small circuit consuming less power may be used, but the boost level may not be set highly precisely.

Figure 1:
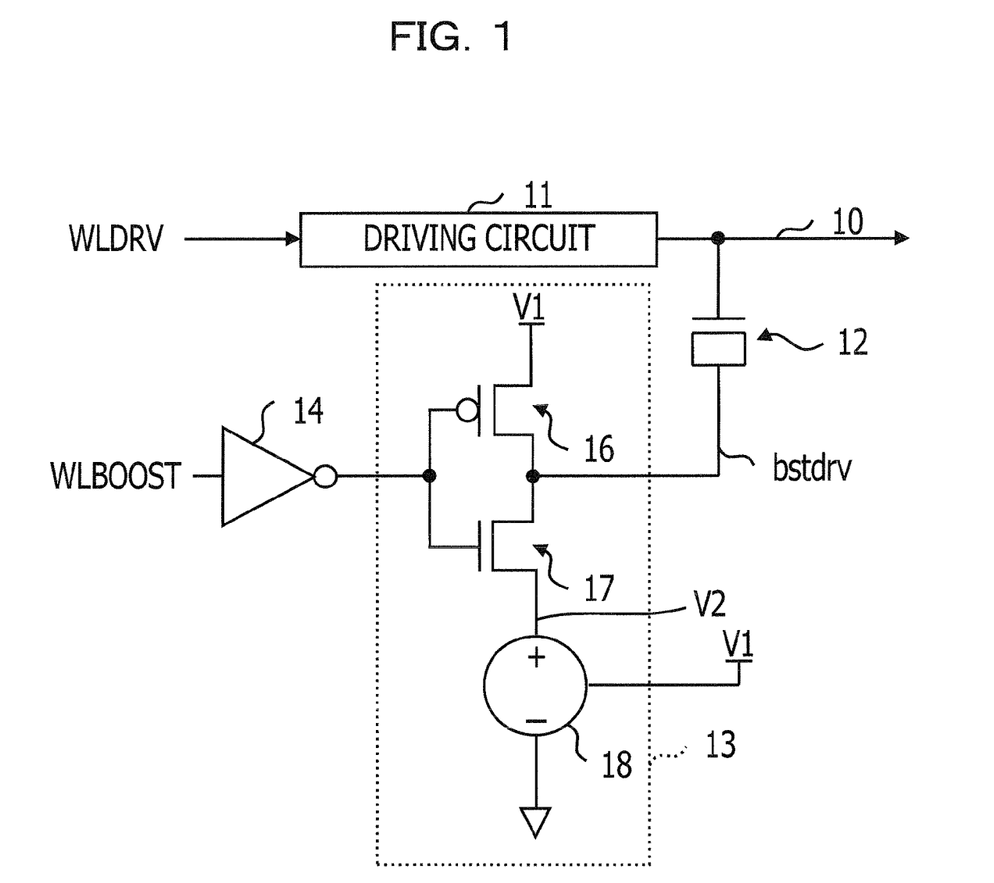
FIG. 1 illustrates an exemplary boost driver.

FIG. 1 illustrates an exemplary boost driver. The boost driver illustrated in FIG. 1 may set a word line to a boost voltage. When a word drive signal WLDRV is applied, a driving circuit 11 activates word lines 10 at a given voltage, e.g., supply voltage VDD. A plurality of word lines 10 is provided, and selected word lines are activated. Each of the word lines 10 is coupled to a gate of a cell transistor, the cell transistor becomes electrically conductive by the activated word line 10 and data is written in the memory cell.

A first end of a boost capacitor 12 is coupled to a word line 10, and a second end is coupled to a boost driver 13. After the word line 10 is set to, for example, the supply voltage VDD, a boost signal WLBOOST to be input to an inverter 14 is applied at a high level, and the boost driver 13 boosts the voltage at the second end of the boost capacitor 12. The voltage at the first end of the boost capacitor 12 is raised through capacitive coupling, and voltage of the word line 10 is boosted to a voltage higher than the supply voltage VDD.

The boost driver 13 includes a PMOS transistor 16, an NMOS transistor 17, and a voltage-drop circuit 18. The voltage lowering circuit 18 gives a certain voltage drop between a first voltage V1 and a second voltage V2. A voltage drop may not depend on the supply voltage. The amount of voltage drop may depend on process variability, etc. For example, the voltage drop may substantially equal the threshold voltage of a transistor.

The PMOS transistor 16 and the NMOS transistor 17 are coupled in series to both the first voltage V1 and the second voltage V2. The PMOS transistor 16 and the NMOS transistor 17 together constitute a boost-drive circuit. A coupling point between the transistors is coupled to the second end of the boost capacitor 12. The PMOS transistor 16 and the NMOS transistor 17 drive the second end of the boost capacitor 12 based on a drive signal bstdrv and, during boost operation, boost the second end of the boost capacitor 12 from the second voltage V2 to the first voltage V1.

Figure 2:
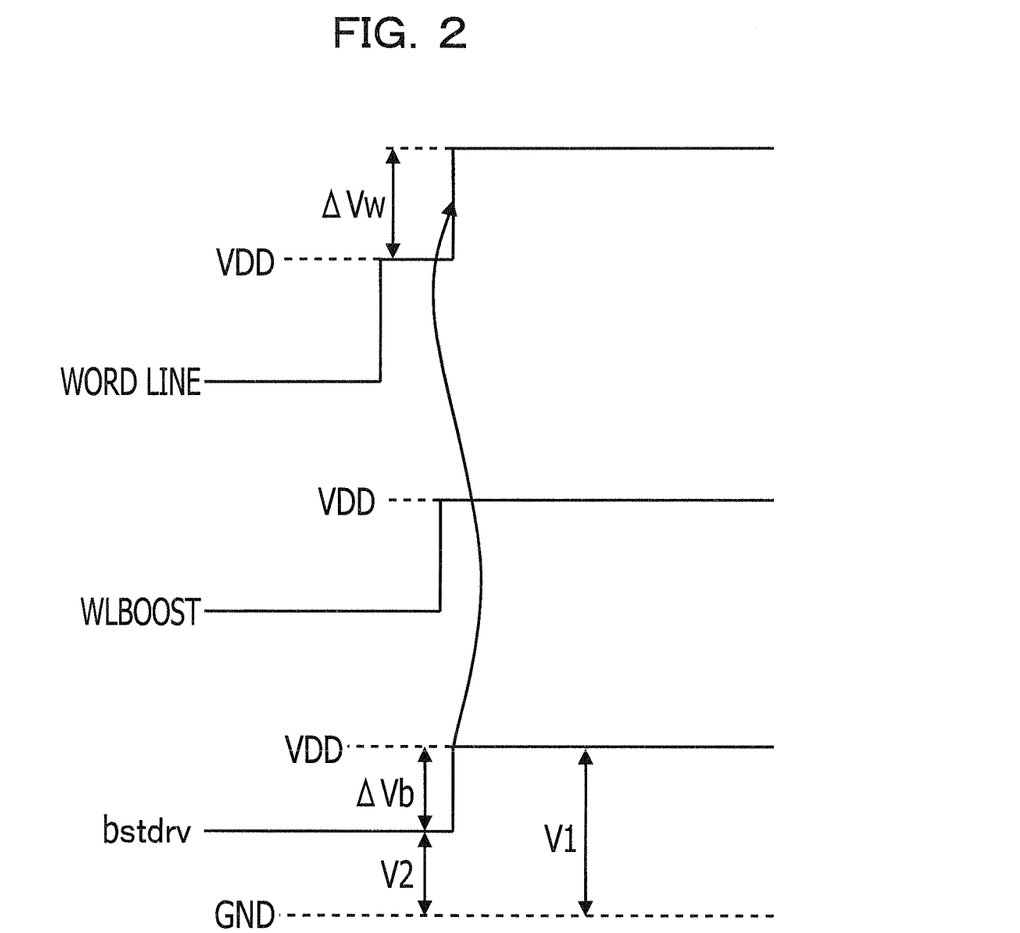
FIG. 2 illustrates an exemplary boosting operating.

FIG. 2 illustrates an exemplary boost operation. The boost driver illustrated in FIG. 1 may carry out the boost operating illustrated in FIG. 2. "WORD LINE" illustrated in FIG. 2 indicates a voltage change in the word line 10. "WLBOOST" illustrated in FIG. 2 indicates a voltage change in the boost signal WLBOOST. "bstdrv" illustrated in FIG. 2 indicates a voltage change in the drive signal bstdrv. The word line 10 is set to the supply voltage VDD by the driving circuit 11, and the boost signal WLBOOST is negated to a low level (e.g., ground voltage GND). The PMOS transistor 16 and the NMOS transistor 17, which are illustrated in FIG. 1, become non-conductive and conductive, respectively. The voltage of the drive signal bstdrv, e.g., the voltage of the second end of the boost capacitor 12, may be substantially equal to the second voltage V2. When the boost signal WLBOOST is applied at a high level, e.g., supply voltage VDD, the PMOS transistor 16 and the NMOS transistor 17, which are illustrated in FIG. 1, become non-conductive and conductive, respectively. The voltage of the drive signal bstdrv, e.g., the voltage of the second end of the boost capacitor 12, rises from the second voltage V2 to the first voltage V1. When voltage of the drive signal bstdrv rises by ΔVb (=V1−V2), the voltage of the word line 10 rises from the supply voltage VDD by ΔVw by capacitive coupling via the boost capacitor 12.

When the capacity of the word line 10 is Cwl and the capacity of the boost capacitor 12 is Cboost, the amount of increase ΔVw in the voltage of the word line 10 is defined by Equation (1).

$$\Delta Vw = \Delta Vb \cdot Cboost / (Cwl + Cboost) \quad (1)$$

When the threshold voltage of the cell transistor is Vth, the voltage of the word line 10 after boosting may be VDD+Vth, and the increase ΔVw in the voltage may be Vth.

$$\Delta Vb = Vth \cdot (Cwl + Cboost) / Cboost$$

For example, when the capacity Cboost of the boost capacitor 12 is set substantially equal to the capacity Cwl of the word line 10, ΔVd may be substantially equal to 2Vth (ΔVd=2Vth). If the voltage-drop circuit 18 generates the voltage V2 which drops a voltage drop of 2Vth from the voltage V1, the voltage increase in the word line 10 may be the appropriate value Vth. Furthermore, for example, when the capacity Cboost of the boost capacitor 12 is set substantially equal to one half of the capacity Cwl of the word line 10, ΔVb equals 3Vth (ΔVb=3Vth). If the voltage-drop circuit 18 generates the second voltage V2 which drops a voltage drop of 3Vth from the first voltage V1, the voltage increase in the word line 10 may be the appropriate value Vth. Since the capacity of the word line 10 is substantially equal to the sum of the gate capacities of the cell transistors coupled to the word line 10, the capacity Cboost of the boost capacitor 12 may be designed by taking this into consideration.

Figure 3:
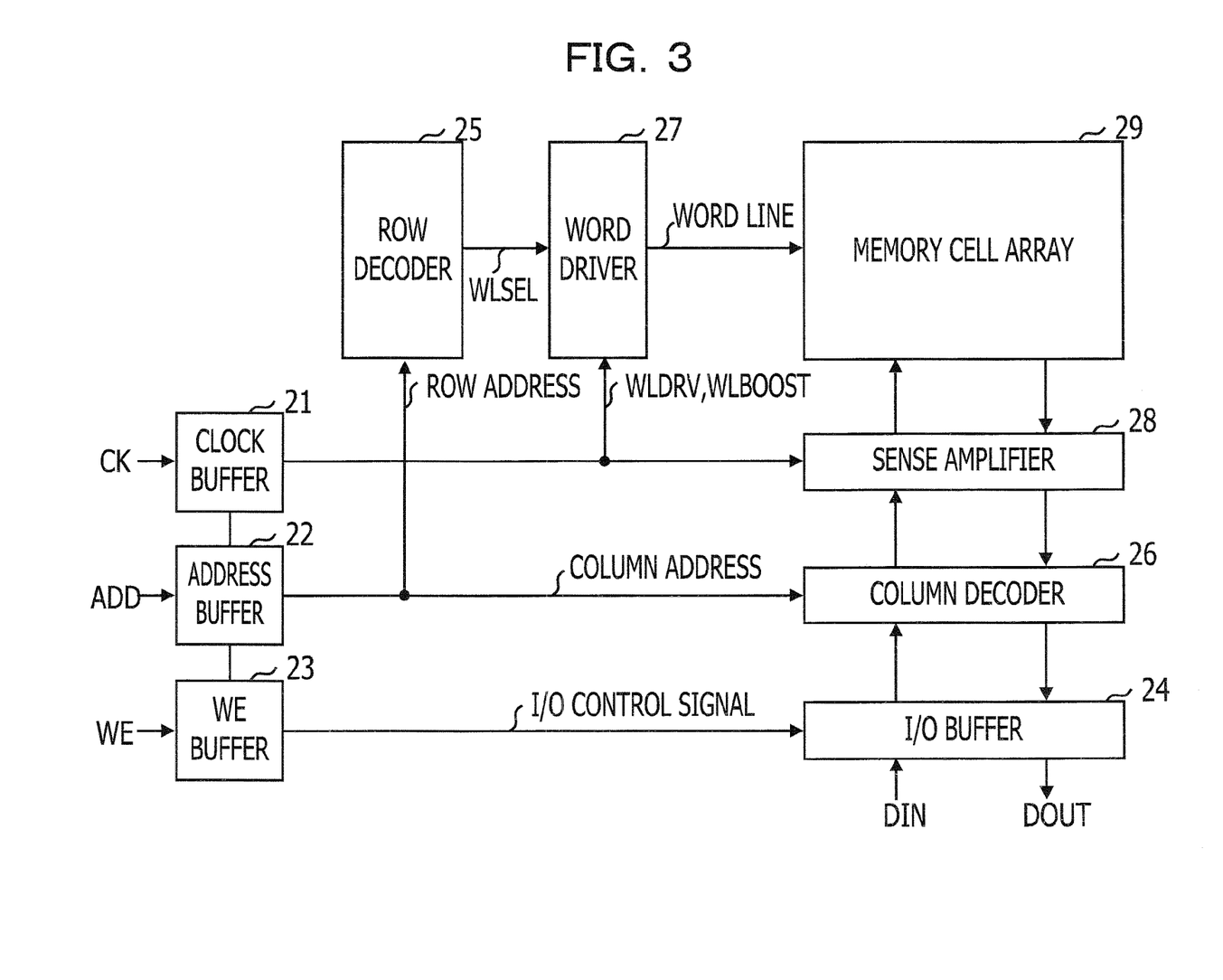
FIG. 3 illustrates an exemplary semiconductor storage apparatus.

FIG. 3 illustrates an exemplary semiconductor storage apparatus. The semiconductor storage apparatus includes a clock buffer 21, an address buffer 22, a WE buffer 23, an I/O buffer 24, a row decoder 25, a column decoder 26, a word driver 27, a sense amplifier 28, and a memory cell array 29. The memory cell array 29 includes a plurality of memory cells arranged in a matrix and circuits and wires for reading from and writing into the memory cells. The memory device of the FRAM includes a ferroelectric body, whereas the memory device of the DRAM includes a capacitor. Each of the memory cells is coupled to a bit line via a cell transistor controlled by a word line. The bit line is coupled to the sense amplifier 28. The sense amplifier 28 detects data by amplifying data read from the memory cell to the bit line.

The clock buffer 21 receives a clock signal CK from an external device, generates an internal control signal, and controls the timing of the semiconductor storage apparatus. The clock buffer 21 includes circuits such as a control signal buffer that receives a control signal from an external device and a command decoder. The clock buffer 21 interprets a command indicated by a control signal and generates an internal control signal at a timing based on the clock signal. The clock buffer 21 supplies clock signals and timing signals for internal control to the various units in the semiconductor storage apparatus.

The address buffer 22 receives an address signal AD from an external device, supplies a row address to the inverter 14, and supplies a column address to the column decoder 26. The WE buffer 23 generates an I/O control signal in accordance with a write signal WE supplied from an external device and supplies the generated I/O control signal to the I/O buffer 24. The I/O buffer 24 operates in accordance with the I/O control signal and, during writing, supplies data to be written from an external device to the memory cell array 29. During reading, the I/O buffer 24 outputs the data read from the memory cell array 29 to an external device.

The row decoder 25 decodes the row address supplied from the address buffer 22 and outputs a word-line selection signal WLSEL for selecting a word line. The word driver 27 activates a word line corresponding to the word-line selection signal WLSEL based on the word drive signal WLDRV supplied from the clock buffer 21. The cell transistor coupled to the activated word line becomes conductive, and data is written in the memory cell or data is read from the memory cell. The word driver 27 of the FRAM includes a plate driver, and the plate line corresponding to the row address is activated.

In the DRAM, a data voltage is stored in the memory cell capacitor, and data is written in. In the FRAM, a data voltage is applied to one end of a ferroelectric device and a high voltage is applied to the other end connected to a plate line; and data is written in.

The column decoder 26 decodes the column address supplied from the address buffer 22 and activates the column line corresponding to the column address. The column transistor becomes conductive, thereby coupling the sense amplifier 28 to the I/O buffer 24.

During a reading operation, data is read from the memory cell coupled to the activated word line to a bit line, and the sense amplifier 28 amplifies the data in the bit line. The data amplified by the sense amplifier 28 is read and supplied to the I/O buffer 24. The read data is output from the I/O buffer 24 as output data DOUT. During a write operation, written data DIN input to the I/O buffer 24 is supplied to the sense amplifier selected by the activated column line. Data is written in the memory cell coupled to the activated word line from the sense amplifier via the bit line.

Figure 4:
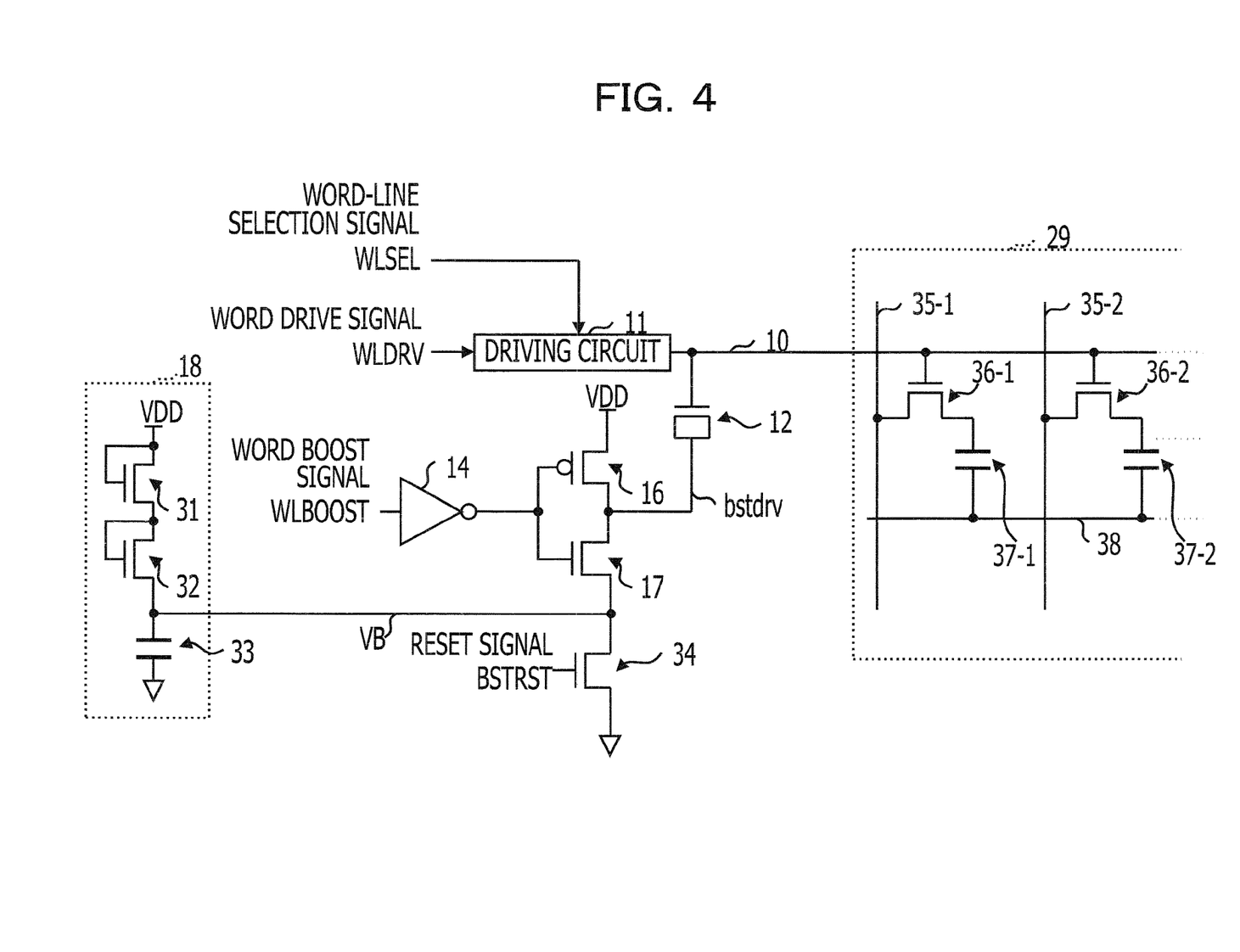
FIG. 4 illustrates an exemplary word driver.

FIG. 4 illustrates an exemplary word driver. The word driver illustrated in FIG. 4 may be the word driver illustrated in FIG. 3. In FIG. 4, elements that are substantially the same or similar to those illustrated in FIG. 1 are represented by the same reference numerals, and descriptions thereof may be omitted or reduced. The word driver includes the driving circuit 11, the boost capacitor 12, the inverter 14, the PMOS transistor 16, the NMOS transistor 17, the voltage-drop circuit 18, and a reset transistor 34. The voltage-drop circuit 18 includes NMOS transistors 31 and 32 and a capacitor 33. The drains of the NMOS transistors 31 and 32 are coupled to a gate, thereby forming a diode connection. The NMOS transistors 31 and 32 are disposed in series between the supply voltage VDD and the ground voltage. The capacitor 33 is coupled in series with the NMOS transistors 31 and 32. The voltage-drop circuit 18 generates a voltage VB that is substantially equal to the voltage lower than the supply voltage VDD by twice the threshold voltage Vth of the NMOS transistor. The reset transistor 34 becomes conductive based on the applied high-level reset signal BSTRST.

The driving circuit 11 is provided for each word line. The driving circuit 11 activates the corresponding word line 10 upon application of the corresponding word-line selection signal WLSEL and the word drive signal WLDRV. The driving circuit 11 includes, for example, a PMOS transistor and an NMOS transistor coupled in series between the supply voltage VDD and the ground voltage, and a coupling point between the PMOS transistor and the NMOS transistor may be coupled to the word line 10. The word drive signal WLDRV may be inverted by the inverter and applied to the gates of the PMOS transistor and the NMOS transistor. The driving circuit 11 may operate by supplying a supply voltage to the driving circuit 11 and may stop by stopping the supply of the supply voltage to the driving circuit 11. The driving circuit 11 may set the word line 10 to a low level, e.g., ground voltage, based on the low-level word drive signal WLDRV.

The word line 10 driven by the driving circuit 11 is coupled to the gates of cell transistors 36-1 and 36-2 of the memory cell array 29. The word line 10 may be coupled to two or more cell transistors. One end of a channel of the cell transistor 36-1 is coupled to a bit line 35-1, and the other end of the channel is coupled to one end of a memory cell 37-1. The other end of the memory cell 37-1 is coupled to a wire 38. One end of a channel of the cell transistor 36-2 is coupled to a bit line 35-2, and the other end of the channel is coupled to one end of a memory cell 37-2. The other end of the memory cell 37-2 is coupled to the wire 38. The memory cells 37-1 and 37-2 of the DRAM are capacitors. The wire 38 of the DRAM is set to a certain voltage, e.g., ground voltage. The memory cells 37-1 and 37-2 of the FRAM are ferroelectric devices. The wire 38 of the FRAM is a voltage-controllable plate line.

Figure 5:
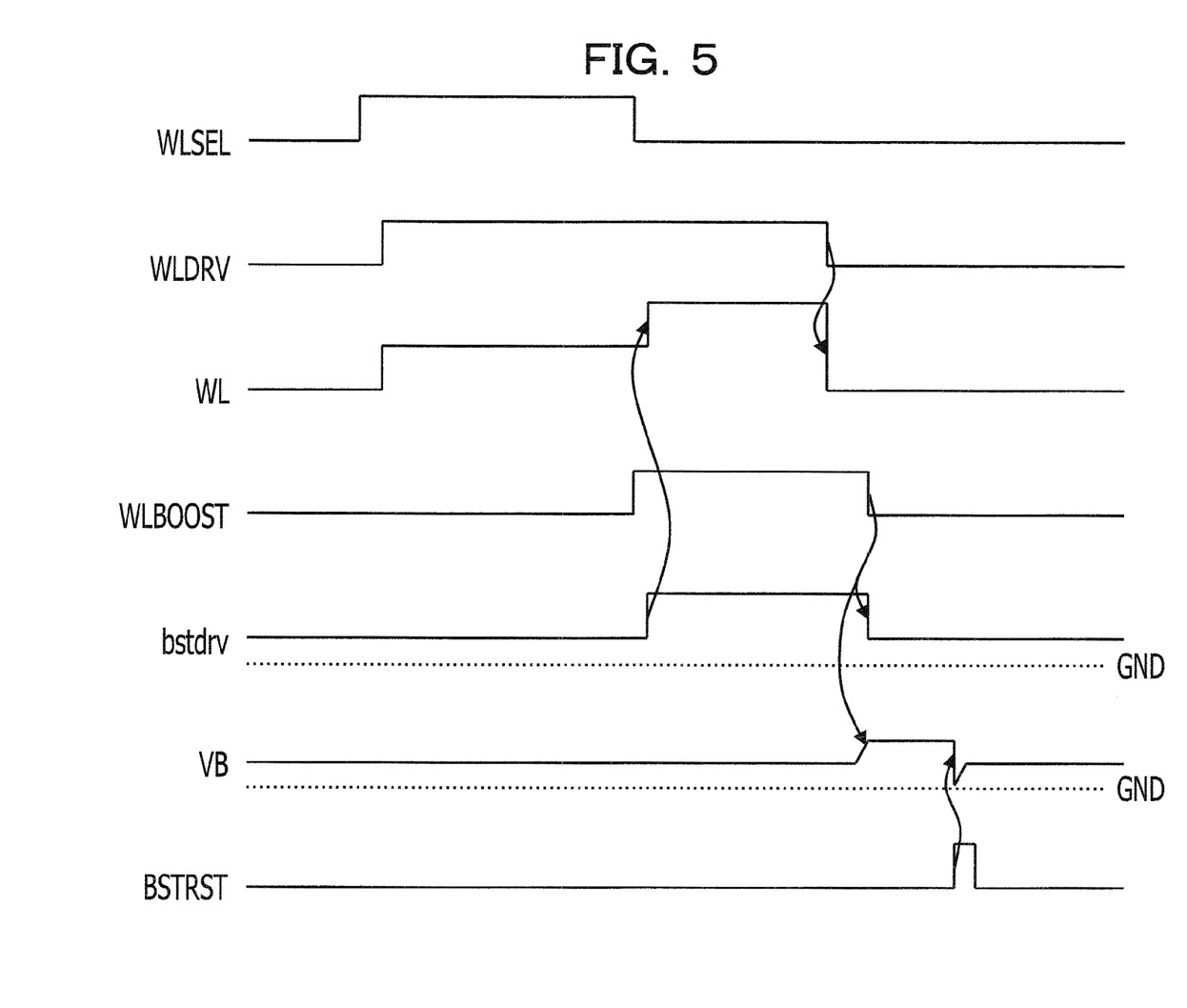
FIG. 5 illustrates an exemplary operation of a word driver.

FIG. 5 illustrates an exemplary operation of a word driver. The word driver illustrated in FIG. 5 may be the word driver illustrated in FIG. 4. A voltage VB illustrated in FIG. 5 may be generated by the voltage-drop circuit 18. In an initial state, the generated voltage VB is a voltage lower than the VDD by 2Vth. The boost signal WLBOOST illustrated in FIG. 5 reaches a low level. The PMOS transistor 16 and the NMOS transistor 17, which are illustrated in FIG. 4, become non-conductive and conductive, respectively. In the initial state, the drive signal bstdrv may be substantially equal to as the voltage VB.

The word-line selection signal WLSEL illustrated in FIG. 5 reaches a high level, and the word drive signal WLDRV illustrated in FIG. 5 reaches a high level. The voltage of the word line 10 illustrated FIG. 5 is activated to a give voltage, e.g., VDD. An electric charge is accumulated in the boost capacitor 12, and the voltage difference between both ends of the boost capacitor 12 is defined by VDD−VB=2Vth. Since an electrical current flows into the capacitor 33 from the word line 10 via the boost capacitor 12, the voltage of the capacitor 33 may rise from the voltage VB, and the voltage difference between both ends of the boost capacitor 12 may be smaller than 2Vth. When the capacity of the capacitor 33 is larger than the capacity of the boost capacitor 12, the voltage change, i.e., increase in the voltage VB, may be ignored. When a resistive device is used instead of the capacitor 33, the voltage-drop circuit 18 may maintain the voltage VB to a voltage lower than the supply voltage VDD by 2Vth.

When the boost signal WLBOOST illustrated in FIG. 5 is applied at a high level, the PMOS transistor 16 and the NMOS transistor 17, which are illustrated in FIG. 4, become non-conductive and conductive, respectively. The drive signal bstdrv illustrated in FIG. 5 rises by 2Vth from the voltage VB to the supply voltage VDD. The word-line selection signal WLSEL illustrated in FIG. 5 is negated to a low level, and the word line 10 is shut off from the supply voltage and is in suspension. The increase of the voltage at one end of the boost capacitor 12 by 2Vth the voltage VB from the supply voltage VDD causes the voltage of the word line 10 coupled to the other end of the boost capacitor 12 to increase from the supply voltage VDD to VDD+2Vth·(Cwl+Cboost). When the capacity Cboost of the boost capacitor 12 is set substantially equal to the capacity Cwl of the word line 10, the voltage increase at the word line 10 equals Vth substantially.

When the voltage increase at the word line 10 is VDD+Vth, the cell transistors 36-1 and 36-2 illustrated in FIG. 4 become conductive. Since the gate voltage of the cell transistors 36-1 and 36-2 are boosted, when the data voltage of the bit lines 35-1 and 35-2 is VDD, the data voltage VDD does not decrease and is written in the memory cells 37-1 and 37-2.

The word drive signal WLDRV illustrated in FIG. 5 reaches a low level, and the word line 10 is deactivated to a low level. An electric charge is accumulated in the boost capacitor 12, and the voltage difference between both ends of the boost capacitor 12 substantially equals VDD. When the boost signal WLBOOST illustrated in FIG. 5 reaches a low level, the PMOS transistor 16 and the NMOS transistor 17, which are illustrated in FIG. 4, become non-conductive and conductive, respectively. The drive signal bstdrv and the voltage VB of the capacitor 33 are coupled, the drive signal bstdrv illustrated in FIG. 5 decreases from the voltage VDD and the voltage VB of the capacitor 33 illustrated in FIG. 5 increases. The reset signal BSTRST illustrated in FIG. 5 reaches a high level, the reset transistor 34 illustrated in FIG. 4 becomes conductive and the voltage VB is reset to the ground voltage. When the reset signal BSTRST returns to a low level, an electric charge is accumulated in the capacitor 33 and the voltage VB equals VDD−2Vth.

Figure 6:
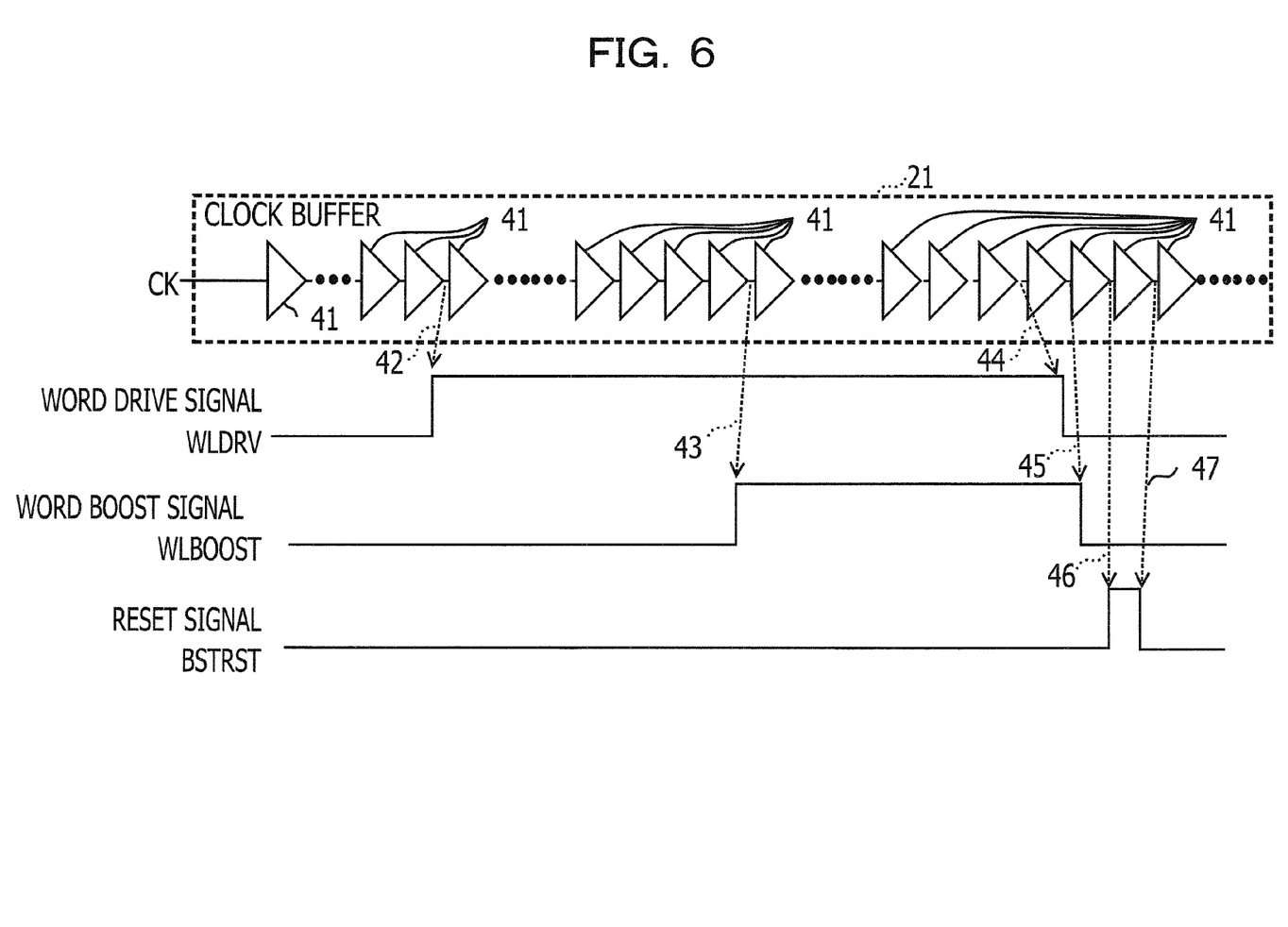
FIG. 6 illustrates an exemplary control-signal generating circuit.

FIG. 6 illustrates an exemplary control-signal generating circuit. The control-signal generating circuit illustrated in FIG. 6 may be the clock buffer 21 illustrated in FIG. 3. The clock buffer 21 includes delay devices 41 each having a cascade-coupled delay element row. When a clock pulse of the clock signal CK is input to the delay devices 41 at an input end, the clock pulse is transmitted through the delay element row. For example, a flip-flop is set by a clock pulse which is taken out from the delay element row at the position indicated by an arrow 42, the flip-flop is reset by a clock pulse which is taken out from the delay element row at the position indicated by an arrow 44 and the word drive signal WLDRV is generated. A flip-flop is set by a clock pulse which is taken out from the delay element row at the position indicated by an arrow 43, the flip-flop is reset by a clock pulse which is taken out from the delay element row at the position indicated by an arrow 45 and the word boost signal WLBOOST is generated. A flip-flop is set by a clock pulse which is taken out from the delay element row at the position indicated by an arrow 46, the flip-flop is reset by a clock pulse which is taken out from the delay element row at the position indicated by an arrow 47 and the reset signal BSTRST is generated. Clock pulses that are transmitted through the delay element row may include pulses generated based on the clock signal CK, e.g., pulses that are selected or generated in accordance with the input timing of a read command or a write command.

Figure 7:
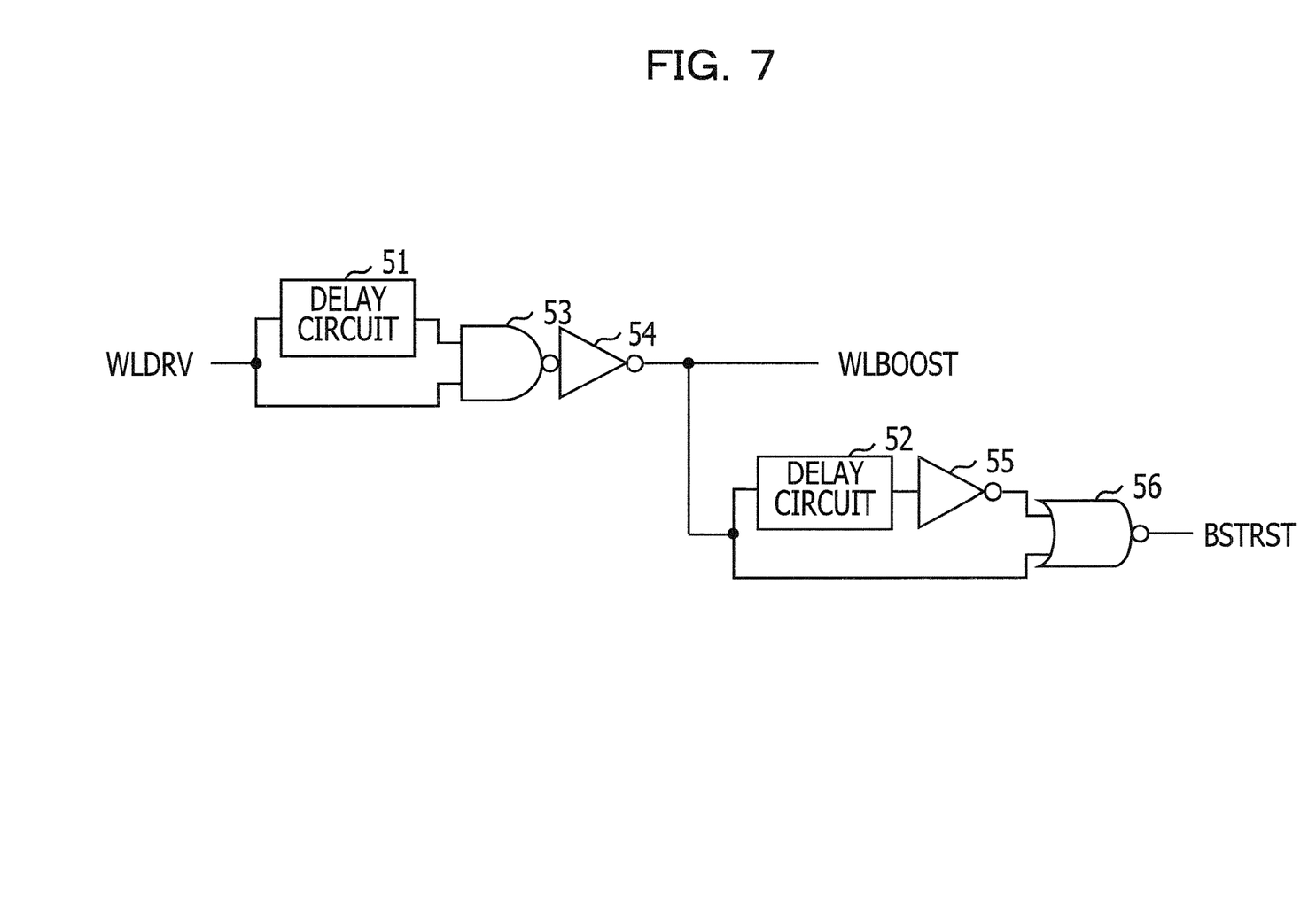
FIG. 7 illustrates an exemplary control-signal generating circuit.

FIG. 7 illustrates an exemplary control-signal generating circuit. The control-signal generating circuit illustrated in FIG. 7 may be included in the clock buffer 21 illustrated in FIG. 3. The control-signal generating circuit includes delay circuits 51 and 52, a NAND circuit 53, inverters 54 and 55, and a NOR circuit 56. The boost signal WLBOOST may be generated by an AND logic of a signal obtained by delaying the word drive signal WLDRV by a given amount of time and the word drive signal WLDRV. The reset signal BSTRST is generated by a NOR logic of a signal obtained by delaying and inverting the boost signal WLBOOST and the boost signal WLBOOST. The word drive signal WLDRV may be generated by setting a flip-flop with a pulse obtained by delaying the pulse that instructs a start of an access operation by a given amount of time and by resetting the flip-flop with a pulse that is delayed even more.

Figure 8:
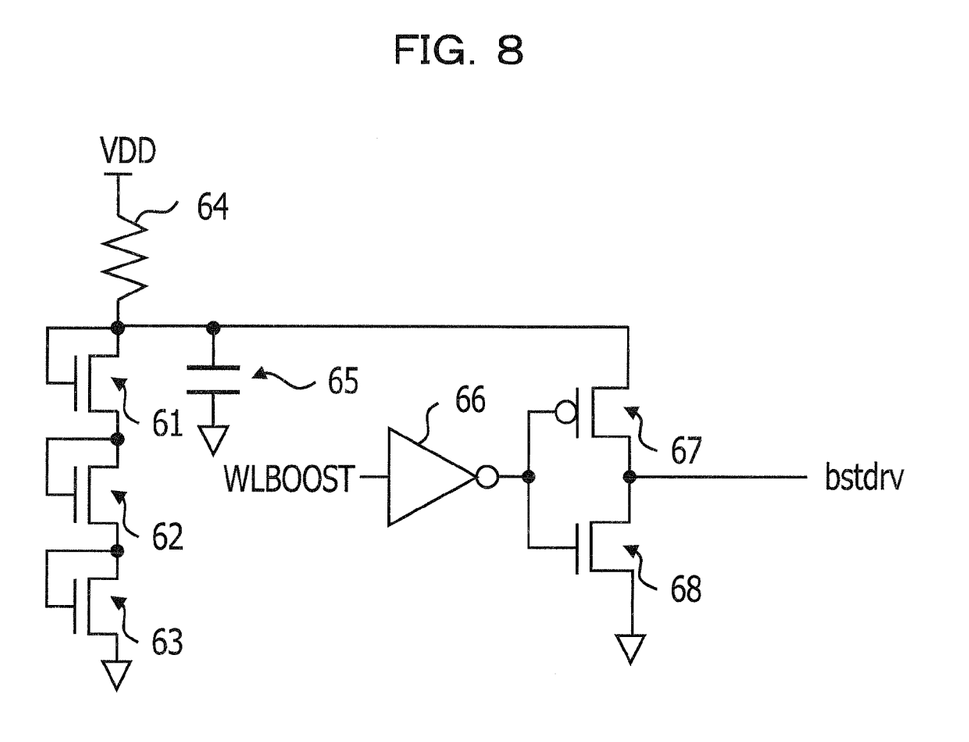
FIG. 8 illustrates an exemplary boost driver.

FIG. 8 illustrates an exemplary boost driver. The boost driver includes NMOS transistors 61, 62, and 63, a resistive device 64, a capacitor 65, an inverter 66, a PMOS transistor 67, and an NMOS transistor 68. The diode-coupled resistive device 64 is coupled in series with the NMOS transistors 61, 62, and 63. The diode-coupled capacitor 65 is coupled in parallel with the NMOS transistors 61, 62, and 63. A given voltage drop is generated between a first voltage at a coupling point between the resistive device 64 and the NMOS transistor 61 and a second voltage, e.g., ground voltage. The PMOS transistor 67 and the NMOS transistor 68 are coupled in series between the first voltage and the second voltage, and the drive signal bstdrv is generated at the coupling point between the PMOS transistor 67 and the NMOS transistor 68. The PMOS transistor 67 and the NMOS transistor 68 boost the drive signal bstdrv from the second voltage to the first voltage during a boost operation. The boost driver illustrated in FIG. 8 performs the boost operation in substantially the same manner as the boost driver illustrated in FIG. 1.

Figure 9:
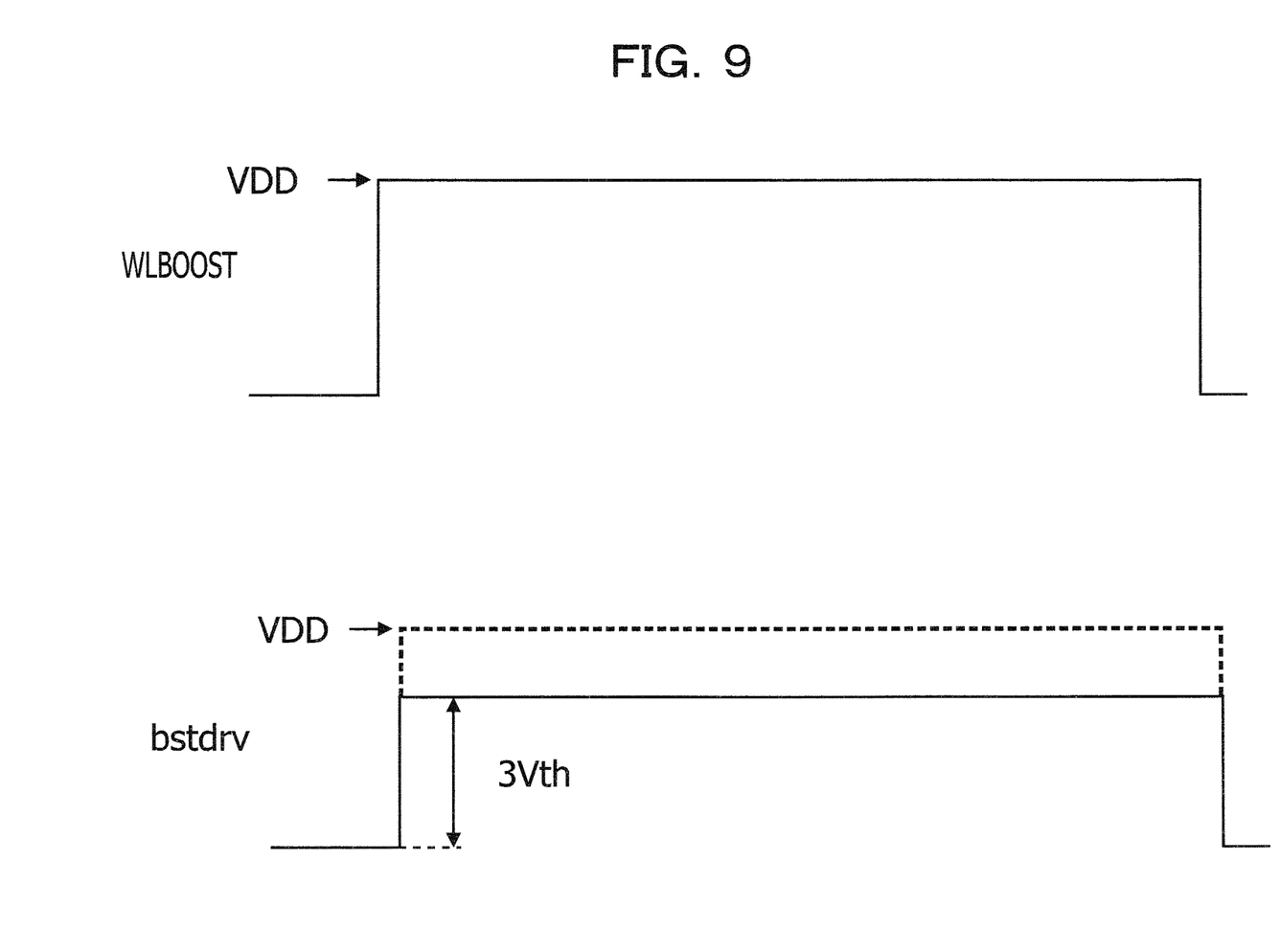
FIG. 9 illustrates an exemplary boost operation.

FIG. 9 illustrates an exemplary boost operation. The boost driver illustrated in FIG. 8 may perform the boost operation illustrated in FIG. 9. When the voltage of the boost signal WLBOOST illustrated in FIG. 9 changes from the ground voltage to the supply voltage VDD, the drive signal bstdrv rises from the ground voltage by 3Vth. Vth may be a threshold voltage of each of the NMOS transistors 61, 62, and 63. The diode-coupled NMOS transistors 61, 62, and 63 coupled in series, as illustrated in FIG. 8, cause a voltage drop of 3Vth.

The capacitor 65 illustrated in FIG. 8 may be provided for quick boosting. The resistance value of the resistive device 64 may be large in order to reduce electric current consumption.

Figure 10:
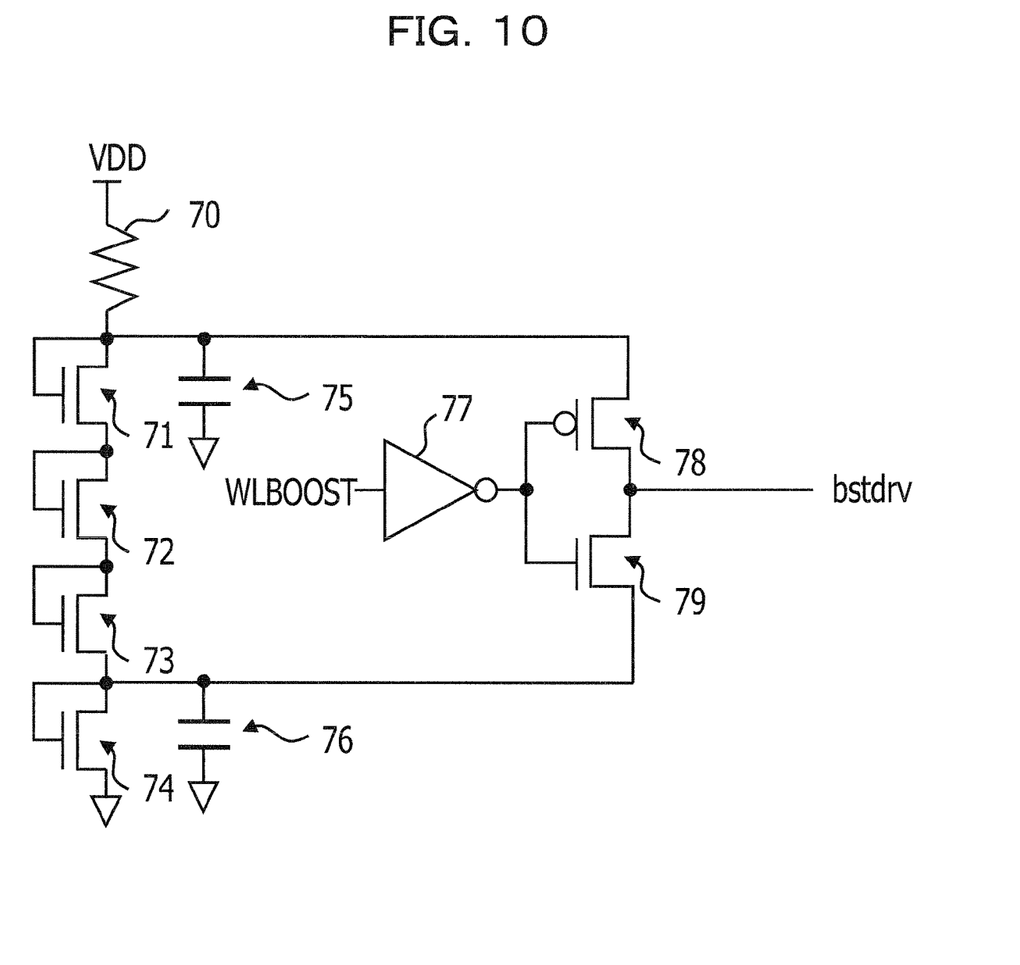
FIG. 10 illustrates an exemplary boost driver.

FIG. 10 illustrates an exemplary boost driver. The boost driver includes a resistive device 70, NMOS transistors 71, 72, 73, and 74, capacitors 75 and 76, an inverter 77, a PMOS transistor 78, and an NMOS transistor 79. The resistive device 70 is coupled in series to the diode-connected NMOS transistors 71, 72, 73, and 74. A given voltage drop is generated between a first voltage at a coupling point between the resistive device 70 and the NMOS transistor 71 and a second voltage at a coupling point between the NMOS transistors 73 and 74. The PMOS transistor 78 and the NMOS transistor 79 are coupled in series between the first voltage and the second voltage, and the drive signal bstdrv is generated at a coupling point between the PMOS transistor 78 and the NMOS transistor 79. The PMOS transistor 78 and the NMOS transistor 79 boost the drive signal bstdrv from the second voltage to the first voltage during boost operation. The boost driver illustrated in FIG. 10 performs boost operation in substantially the same manner as the boost driver illustrated in FIG. 1.

Figure 11:
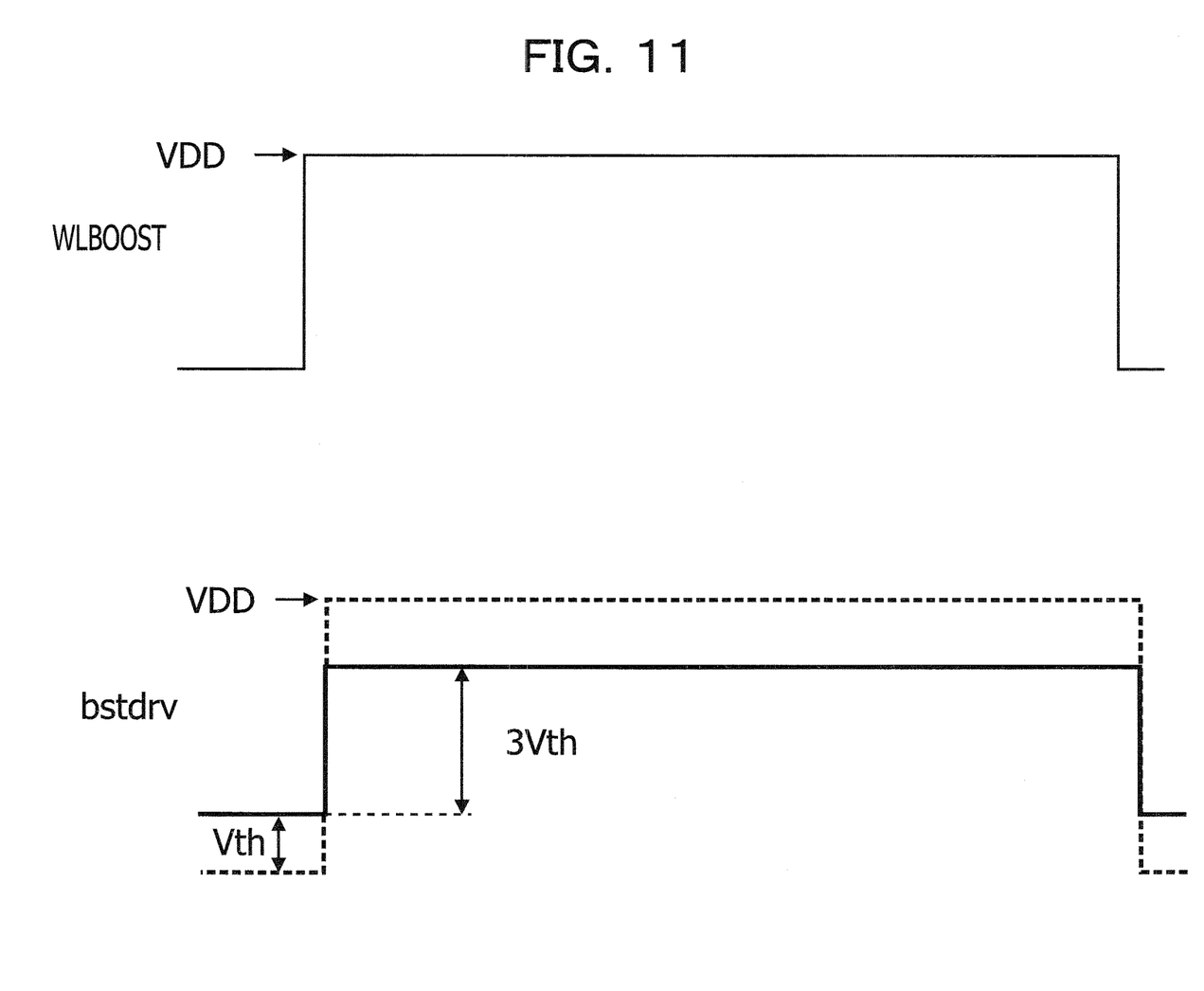
FIG. 11 illustrates an exemplary boost operation.

FIG. 11 illustrates an exemplary boost operation. The boost driver illustrated in FIG. 10 may perform the boost operation illustrated in FIG. 11. When the voltage of the boost signal WLBOOST illustrated in FIG. 11 changes from the ground voltage to the supply voltage VDD, the drive signal bstdrv rises by 3Vth from Vth to 4Vth. Vth may be the threshold value of each of the NMOS transistors 71, 72, 73, and 74. The diode-coupled NMOS transistors 71, 72 and 73 are coupled in series, as illustrated in FIG. 10, cause a voltage drop of 3Vth.

Figure 12:
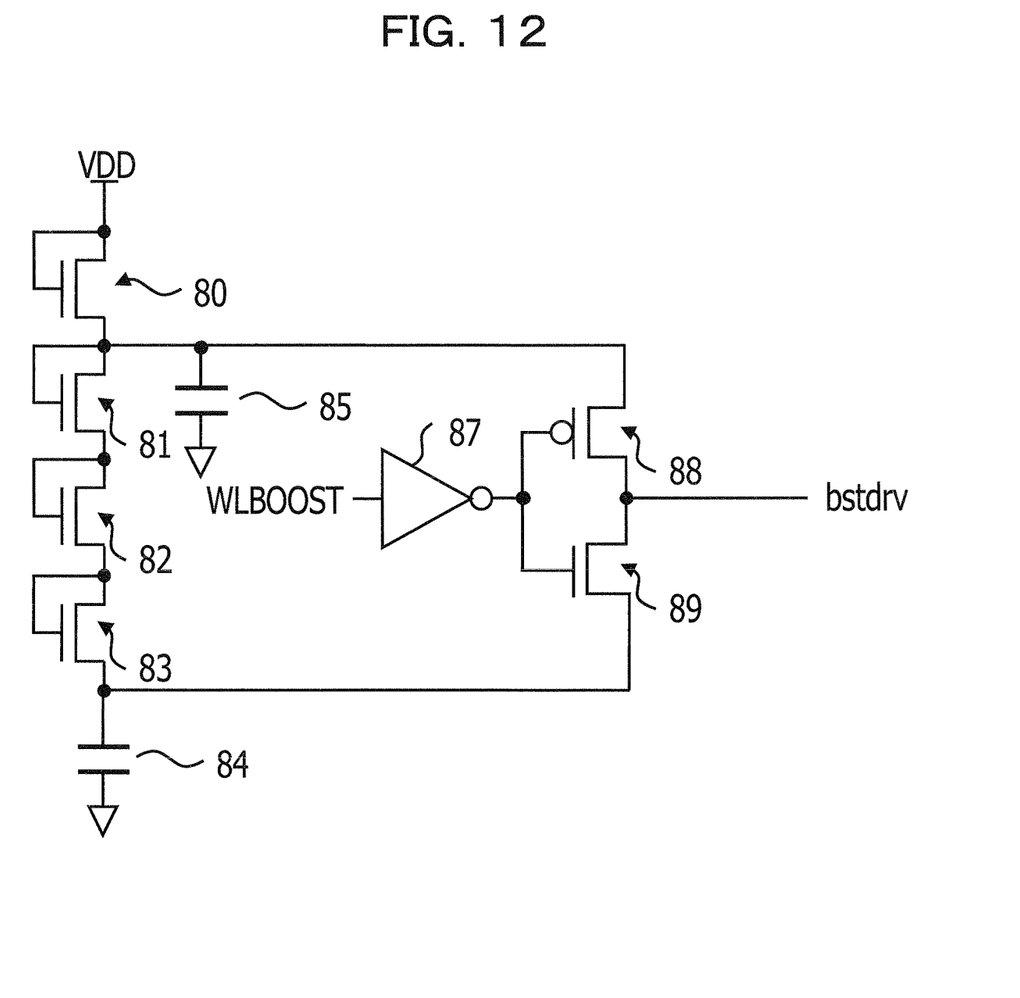
FIG. 12 illustrates an exemplary boost driver.

FIG. 12 illustrates an exemplary boost driver. The boost driver includes NMOS transistors 80, 81, 82, and 83, capacitors 84 and 85, an inverter 87, a PMOS transistor 88, and an NMOS transistor 89. The NMOS transistors 80, 81, 82, and 83 are diode coupled. The capacitor 84 is coupled in series with the NMOS transistors 80, 81, 82, and 83. The capacitor 85 is coupled in parallel with the diode-coupled NMOS transistors 81, 82, and 83. A given voltage drop is generated between a first voltage at a coupling point between the NMOS transistors 80 and 81 and a second voltage at a coupling point between the NMOS transistor 83 and the capacitor 84. The PMOS transistor 88 and the NMOS transistor 89 are coupled in series to both the first voltage and the second voltage, and the drive signal bstdrv is generated at a coupling point between the PMOS transistor 88 and the NMOS transistor 89. The PMOS transistor 88 and the NMOS transistor 89 raise the drive signal bstdrv from the second voltage to the first voltage during boost operation. The boost driver illustrated in FIG. 12 performs the boost operation in substantially the same manner as the boost driver illustrated in FIG. 1.

Figure 13:
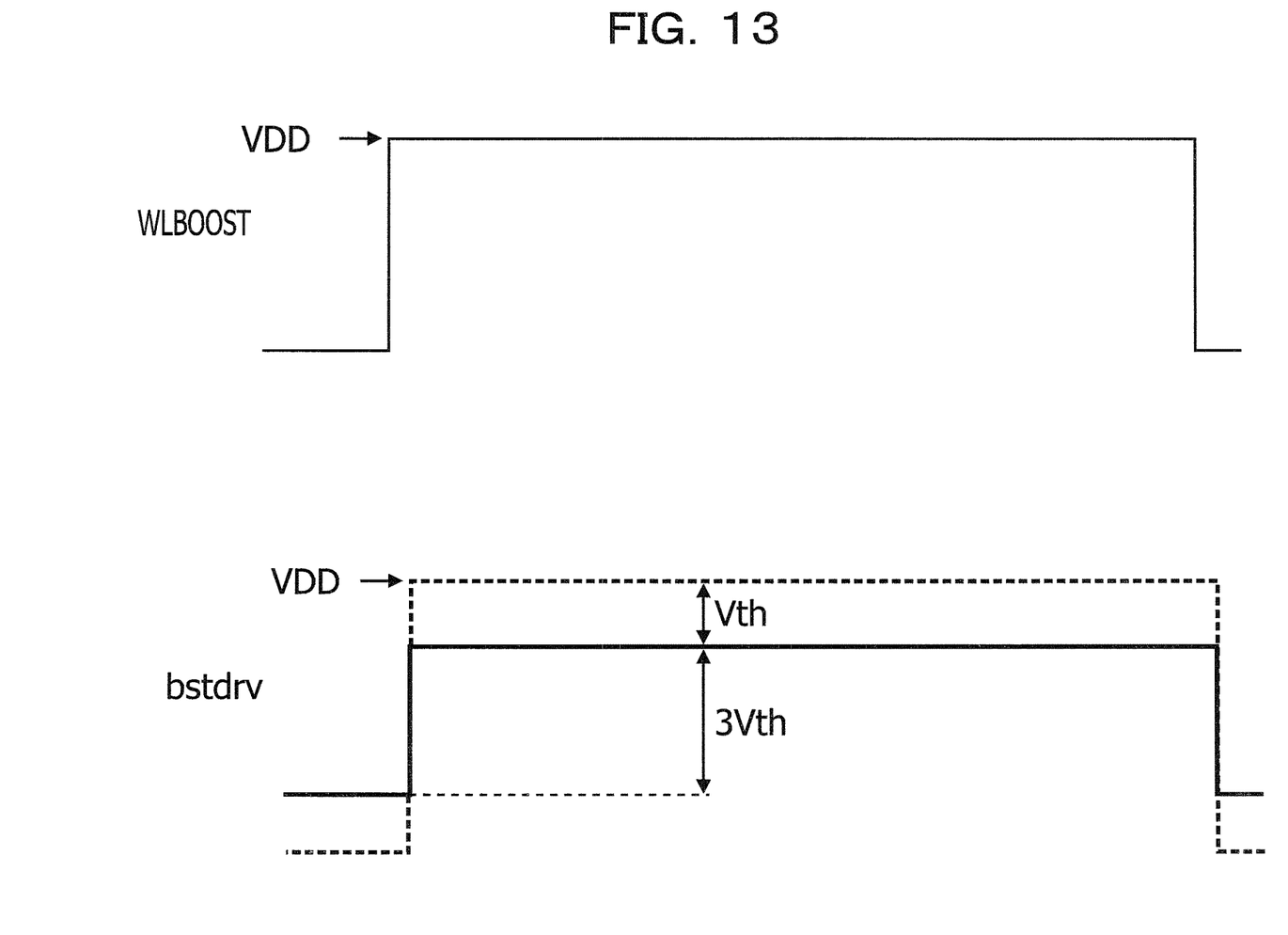
FIG. 13 illustrates an exemplary example of boost operation.

FIG. 13 illustrates an exemplary boost operation. The boost driver illustrated in FIG. 12 may perform the boost operation illustrated in FIG. 13. When the boost signal WLBOOST illustrated in FIG. 13 changes from the ground voltage to the supply voltage VDD, the drive signal bstdrv rises by 3Vt from VDD-4Vth to VDD-Vth. Vth may be the threshold voltage of each of the NMOS transistors 81, 82, and 83. The diode-coupled NMOS transistors 81, 82, and 83 coupled in series, as illustrated in FIG. 12, may cause a voltage drop of 3Vth.

Figure 14:
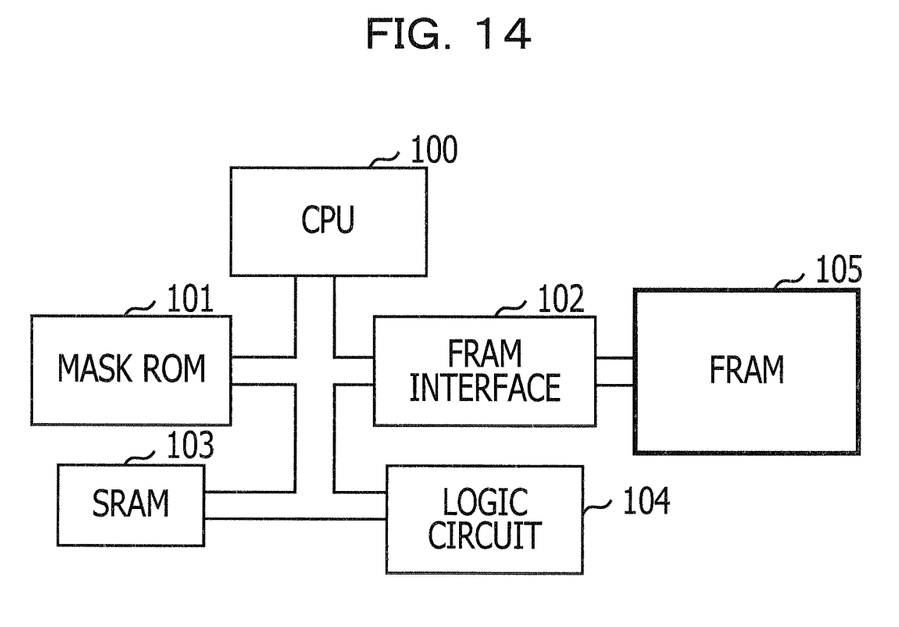
FIG. 14 illustrates an exemplary system.

FIG. 14 illustrates an exemplary system. The illustrated system includes a central process unit (CPU) 100, a mask ROM 101, an FRAM interface 102, a static random access memory (SRAM) 103, a logic circuit 104, and an FRAM 105. The FRAM 105 may be the semiconductor storage apparatus illustrated in FIG. 3. The system may include a DRAM. The CPU 100 may operate based on data and programs stored in the FRAM 105 to carry out data process etc. The process results by the CPU 100 may be stored in the FRAM 105. The SRAM 103 may be a small-capacity, high-speed accessible memory. Basic programs, system setting, and so on executed by the CPU 100 may be stored in the mask ROM 101. The logic circuit 104 carries out logic process based on control by the CPU 100.

Example embodiments of the present invention have now been described in accordance with the above advantages. It will be appreciated that these examples are merely illustrative of the invention. Many variations and modifications will be apparent to those skilled in the art.

The invention claimed is:

1. A semiconductor storage apparatus comprising:
   a word line coupled to a cell transistor;
   a first capacitor having a first end coupled to the word line;
   a boost driver coupled to a second end of the first capacitor;
   a voltage-drop circuit configured to generate a given voltage drop between a first voltage and a second voltage; and
   a boost-drive circuit, coupled to a second end of the first capacitor, configured to boost a voltage at the second end from the second voltage to the first voltage,
   wherein the boost-drive circuit is provided between a first voltage supply that supplies the first voltage and a second voltage supply that supplies the second voltage, and the voltage-drop circuit generates the given voltage drop at a node between the boost-drive circuit and the second voltage supply,
   wherein the voltage-drop circuit is disposed between the first supply voltage and the second supply voltage and includes a diode-coupled transistor,
   wherein the diode-coupled transistor generates a voltage drop, and
   wherein the voltage-drop circuit includes a second capacitor coupled to the diode-coupled transistor.

2. A semiconductor storage apparatus comprising:
   a word line coupled to a cell transistor;

a first capacitor having a first end coupled to the word line;
a voltage-drop circuit configured to generate a given voltage drop between a first voltage and a second voltage; and
a boost-drive circuit, coupled to a second end of the first capacitor, configured to boost a voltage at the second end from the second voltage to the first voltage,
wherein the voltage-drop circuit is disposed between a first voltage supply and a second voltage supply and includes a diode-coupled transistor, and wherein the diode-coupled transistor generates a voltage drop,
wherein the voltage-drop circuit includes a second capacitor coupled to the diode-coupled transistor.

3. The semiconductor storage apparatus according to claim 2, further comprising:
a switch circuit configured to discharge an electric charge of the second capacitor.

4. The semiconductor storage apparatus according to claim 1, wherein the voltage-drop circuit includes a resistor coupled to the diode-coupled transistor.

5. A semiconductor storage apparatus comprising:
a word line coupled to a cell transistor;
a first capacitor having a first end coupled to the word line;
a boost driver coupled to a second end of the first capacitor;
a voltage-drop circuit configured to generate a given voltage drop between a first voltage and a second voltage; and
a boost-drive circuit, coupled to a second end of the first capacitor, configured to boost a voltage at the second end from the second voltage to the first voltage,
wherein the boost-drive circuit is provided between a first voltage supply that supplies the first voltage and a second voltage supply that supplies the second voltage, and the voltage-drop circuit generates the given voltage drop at a node between the boost-drive circuit and the second voltage supply;
wherein the voltage-drop circuit is disposed between the first supply voltage and the second supply voltage and includes a diode-coupled transistor;
wherein the diode-coupled transistor generates a voltage drop;
wherein the voltage-drop circuit includes a second capacitor coupled to the diode-coupled transistor;
wherein the voltage-drop circuit includes a resistor coupled to the diode-coupled transistor, and
wherein the voltage-drop circuit includes a third capacitor coupled to the diode-coupled transistor.

6. The semiconductor storage apparatus according to claim 1,
wherein the boost-drive circuit includes a PMOS transistor and an NMOS transistor that are coupled between the first voltage and the second voltage, and
wherein a coupling point between the PMOS transistor and the NMOS transistor is coupled to the second end.

7. A boost method of a word line comprising:
setting a word line to a first voltage which is supplied from a first voltage supply, the word line coupled to a first end of a capacitor;
generating, at node between one end of a boost-drive circuit and a second voltage supply which supplies a second voltage, a given voltage drop between a first voltage and a second voltage by a voltage drop circuit, the voltage drop circuit being disposed between the first supply voltage and the second supply voltage and including a diode-coupled transistor which generates a voltage drop and a second capacitor coupled to the diode-coupled transistor;
setting a word line to a given voltage; and
raising, by the boost-drive circuit, a voltage at a second end of the capacitor having a first end coupled to the word line from the second voltage to the first voltage after the word line is set to the first given voltage.

8. A system comprising:
a memory; and
a controller configured to control the memory,
wherein the memory includes:
a word line coupled to a cell transistor;
a first capacitor having a first end coupled to the word line;
a boost driver coupled to a second end of the first capacitor;
a voltage-drop circuit configured to generate a given voltage drop between a first voltage and a second voltage; and
a boost-drive circuit, coupled to a second end of the first capacitor, configured to boost a voltage at the second end from the second voltage to the first voltage,
wherein the boost-drive circuit is provided between a first voltage supply that supplies the first voltage and a second voltage supply that supplies the second voltage, and the voltage-drop circuit generates the given voltage drop at a node between the boost-drive circuit and the second voltage supply,
wherein the voltage-drop circuit is disposed between a first voltage supply and a second voltage supply and includes a diode-coupled transistor, and wherein the diode-coupled transistor generates a voltage drop,
wherein the voltage-drop circuit includes a second capacitor coupled to the diode-coupled transistor.

9. A semiconductor storage apparatus comprising:
a word line coupled to a cell transistor;
a first capacitor having a first end coupled to the word line;
a voltage-drop circuit configured to generate a given voltage drop between a first voltage and a second voltage; and
a boost-drive circuit configured to boost a voltage at a second end of the first capacitor from the second voltage to the first voltage,
wherein the boost-drive circuit includes a first transistor and a second transistor that are coupled between the first voltage and the second voltage,
wherein a coupling point between the first transistor and one end of the second transistor is coupled to the second end, and
wherein the voltage-drop circuit couples to the other end of the second transistor,
wherein the voltage-drop circuit is disposed between a first voltage supply and a second voltage supply and includes a diode-coupled transistor, and wherein the diode-coupled transistor generates a voltage drop,
wherein the voltage-drop circuit includes a second capacitor coupled to the diode-coupled transistor.

10. The semiconductor storage apparatus according to claim 9, wherein the first transistor is a PMOS transistor and the second transistor is an NMOS transistor.

* * * * *